United States Patent [19]

Murakami

[11] Patent Number: 6,090,458

[45] Date of Patent: Jul. 18, 2000

[54] METHOD AND APPARATUS FOR FILM FORMATION BY CHEMICAL VAPOR DEPOSITION

[75] Inventor: Shingo Murakami, Tokyo, Japan

[73] Assignee: NEC Corporation, Tokyo, Japan

[21] Appl. No.: 08/814,960

[22] Filed: Mar. 10, 1997

Related U.S. Application Data

[63] Continuation of application No. 08/576,248, Dec. 21, 1995, abandoned.

[30] Foreign Application Priority Data

Dec. 22, 1994 [JP] Japan .................................. 6-320729

[51] Int. Cl.$^7$ .............................. C23C 8/00; C23C 16/00
[52] U.S. Cl. ......................... 427/586; 118/720; 118/722; 118/724; 427/255.23; 427/595
[58] Field of Search .................................... 427/586, 595, 427/225.23; 118/720, 724, 722

[56] References Cited

U.S. PATENT DOCUMENTS 4,762,803  8/1988  Sato et al. .................................. 437/24
4,910,163  3/1990  Jain ........................................... 437/81
5,011,706  4/1991  Tarhay et al. ............................. 427/39

FOREIGN PATENT DOCUMENTS 2-260527  10/1990  Japan .
4-295851  10/1992  Japan .

*Primary Examiner*—Bernard Pianalto
*Attorney, Agent, or Firm*—Sughrue, Mion, Zinn Macpeak & Seas, PLLC

[57] ABSTRACT

Powdery $Cr(CO)_6$ is stored in a reservoir, into which Ar gas, under flow rate control by a flow rate controller, is introduced. On the other hand, He gas, whose molecular weight differs from that of Ar gas, is also introduced into the reservoir under flow rate control by another flow rate controller. These Ar and He gases are used as carrier gases for feeding a reactive gas into a chamber. The reservoir sublimates the powdery $Cr(CO)_6$ stored therein. The $Cr(CO)_6$ obtained by sublimation is carried by the Ar and He gases which are introduced into the reservoir, and supplied onto a substrate in the chamber. The substrate is irradiated with a laser beam. This irradiation with the laser beam decomposes the $Cr(CO)_6$ gas to form a film of metallic chromium on the substrate.

36 Claims, 9 Drawing Sheets

METHOD AND APPARATUS FOR FILM FORMATION BY CHEMICAL VAPOR DEPOSITION

This is a Continuation of application Ser. No. 08/576,248, filed Dec. 21, 1995, abandoned.

BACKGROUND OF THE INVENTION

1. Field of the Invention

The present invention relates to a method and an apparatus for resolving a reactive gas and depositing a film on a substrate by chemical vapor deposition (CVD) using a laser beam, and more particularly to a film formation method and apparatus which make it possible to control the concentration of the reactive gas with high precision and to change the concentration in a short period of time.

2. Description of the Related Art

Film formation methods using laser CVD are generally greater in the velocity at which the film is deposited on the substrate, in other words the reaction rate of the reactive gas, than film formation methods using reduced pressure CVD, plasma CVD or metal organic CVD (MOCVD) which are applied to semiconductor manufacturing processes. Accordingly, in the methods using laser CVD, the volume, namely the concentration, of the reactive gas supplied into the chamber significantly affects the stability of the film formation process and the properties and shape of the film that is deposited. In view of this fact, the requirement to accurately control the supply volume on the reactive gas has become increasingly stringent in recent years so that the film can be formed exactly as intended.

In a laser CVD apparatus according to the prior art disclosed in the Japanese Patent Laid-open No. 1992-295851, a reactive gas 2 is supplied into a chamber 3 by a gas supply source 1 as illustrated in FIG. 1. In a reservoir 4, constituting the gas supply source 1, organic metallic compound 5, such as chromium carbonyl $(Cr(CO)_6)$ powder, is stored in advance. By heating the reservoir 4 to a prescribed temperature, the organic metallic compound 5 is sublimated to obtain the reactive gas 2. A predetermined amount of one kind of carrier gas 6, such as argon (Ar) gas, is fed into the reservoir 4, and reactive gas 2 of a desired concentration is obtained by mixing this carrier gas 6 and reactive gas 2. That reactive gas 2 adjusted in concentration is supplied into the chamber 3, wherein the laser CVD process takes place. The concentration of the reactive gas 2 in this conventional laser CVD apparatus is managed by controlling the flow rate of the carrier gas 6, fed into the reservoir 4 whose temperature is kept constant. The flow rate of the carrier gas 6 is controlled by a flow rate regulator, such as a mass flow controller 7.

Incidentally, in the chember 3 as illustrated in FIG. 1, a substrate 8 is mounted on an XY stage 10, and is irradiated with a laser beam 12 via a glass window 11.

Generally, the way the reactive gas 2, supplied from a gas inlet port 9, flows differs between the case shown in FIG. 2A wherein the film is deposited on the substrate 8 in its central part and that shown in FIG. 2B wherein the deposition takes place on the peripheral part of the substrate 8. Especially in the peripheral part of the substrate 8, where the leak of the reactive gas 2 from the substrate 8 is present in a large amount, the concentration of the reactive gas 2 becomes diluted. Therefore, when the area in which the film is to be deposited is the peripheral part of the substrate 8, the concentration of the reactive gas 2 introduced from the gas inlet port 9 has to be increased in order to deposit a film of high quality. Especially, when a plurality of films are to be deposited on the same substrate 8 in its central and peripheral parts, the concentration of the reactive gas 2 has to be changed quickly to match each particular area of deposition.

SUMMARY OF THE INVENTION

An object of the present invention is to provide a film formation method and apparatus which make it possible to control the concentration of the reactive gas with high precision.

Another object of the invention is to provide a film formation method and apparatus which make it possible to change the concentration of the reactive gas in a short period of time.

Still Another object of the invention is to provide a film formation method and apparatus which make it possible to change the supply volume of the reactive gas in accordance with a predetermined sequence for film formation.

In order to achieve the aforementioned objects, by the film formation method according to the invention, a reactive gas is supplied into a reaction chamber using a mixture of at least two kinds of gases differing from each other in molecular weight. The substrate placed in the chamber is irradiated with a laser beam to thereby deposit a film on the substrate.

More particularly, the concentration of the reactive gas supplied into the reaction chamber is changed by modifying the blending ratio between the at least two kinds of gases constituting the mixture.

A film formation apparatus according to the invention is provided with a means for supplying a reactive gas into a reaction chamber using a mixture of at least two kinds of gases differing from each other in molecular weight and irradiating a substrate placed in the chamber with a laser beam to thereby deposit a film on the substrate.

More particularly, a film formation apparatus according to the invention is further provided with means for controlling the concentration of the reactive gas supplied into the reaction chamber by modifying the blending ratio between the at least two kinds of gases constituting the mixture.

BRIEF DESCRIPTION OF THE DRAWINGS

The above-mentioned and other objects, advantages and features of the present invention will become more apparent from the following detailed description when taken in conjunction with the accompanying drawings, wherein.

DETAILED DESCRIPTION OF THE PREFERRED EMBODIMENTS

Now will be described in detail a first preferred embodiment of the invention with reference to FIG. 3.

The first preferred embodiment of the present invention is provided with at least two lines of carrier gas introduction for one reservoir, each line using a gas of a different molecule weight as carrier gas, and controls the concentration of the reactive gas carried into the chamber by modifying the blending ratio between the carrier gases of different molecular weights introduced into the reservoir. In this way, this embodiment not only enables the reactive gas concentration to be controlled precisely but also the concentration to be modified in quick response.

Figure 1:
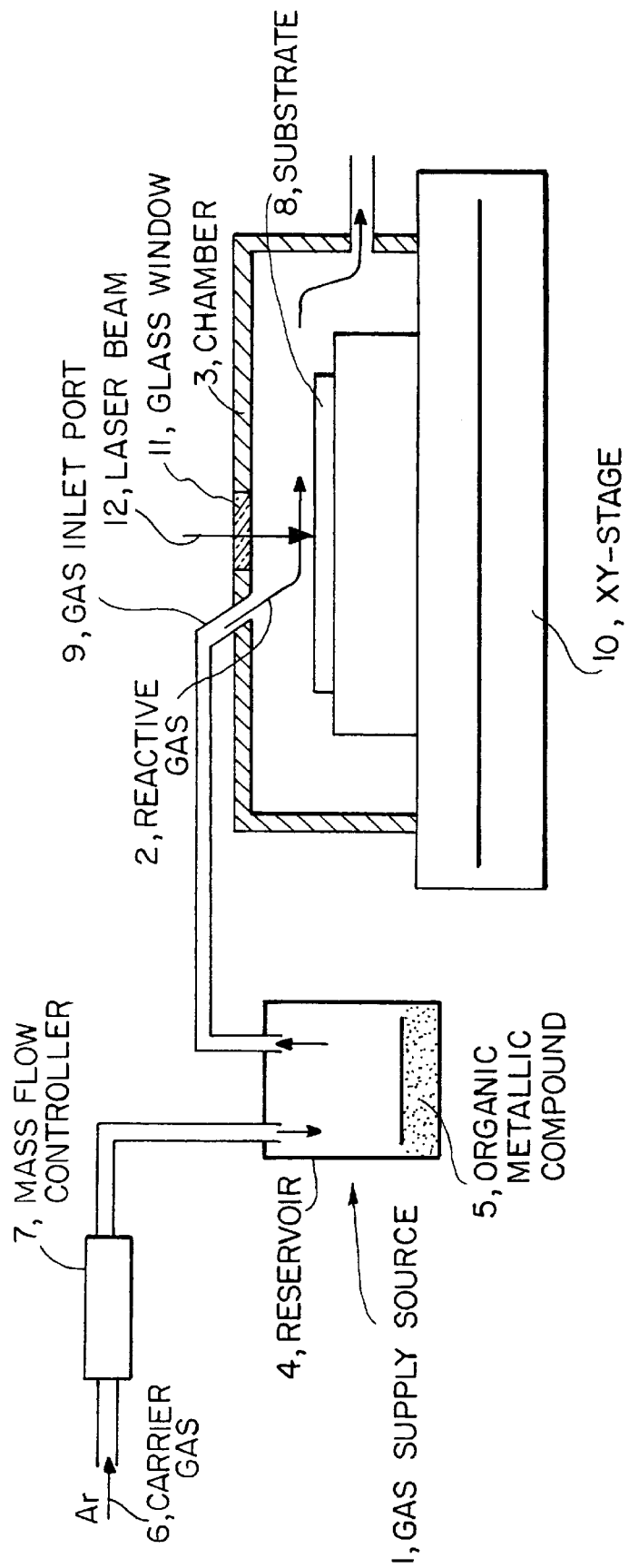
FIG. 1 illustrates a configuration for the introduction of a reactive gas into a chamber in a laser CVD apparatus according to the prior art.
Figure 2A:
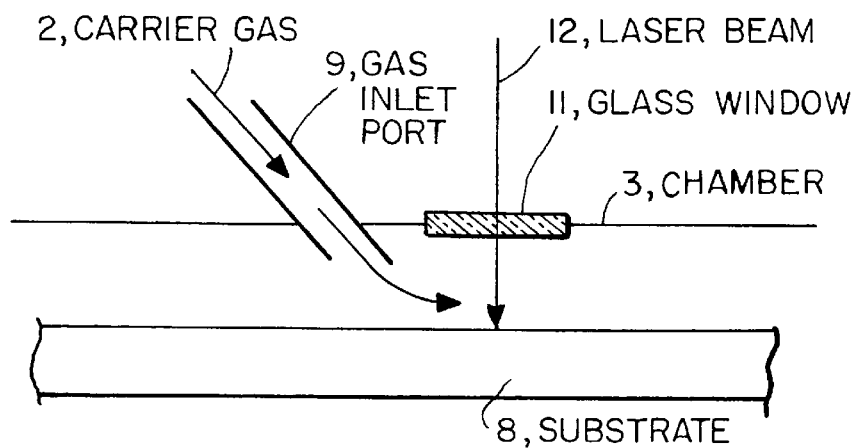
FIG. 2A illustrates a case in which the reactive gas is supplied to the central part of the substrate in the laser CVD apparatus according to the prior art.
Figure 2B:
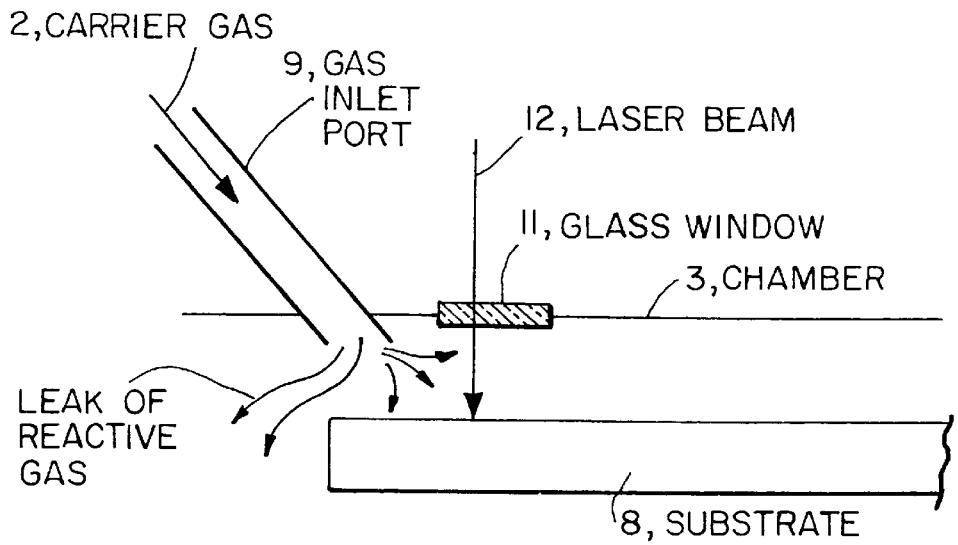
FIG. 2B illustrates a case in which the reactive gas is supplied to the peripheral part of the substrate in the laser CVD apparatus according to the prior art.
Figure 3:
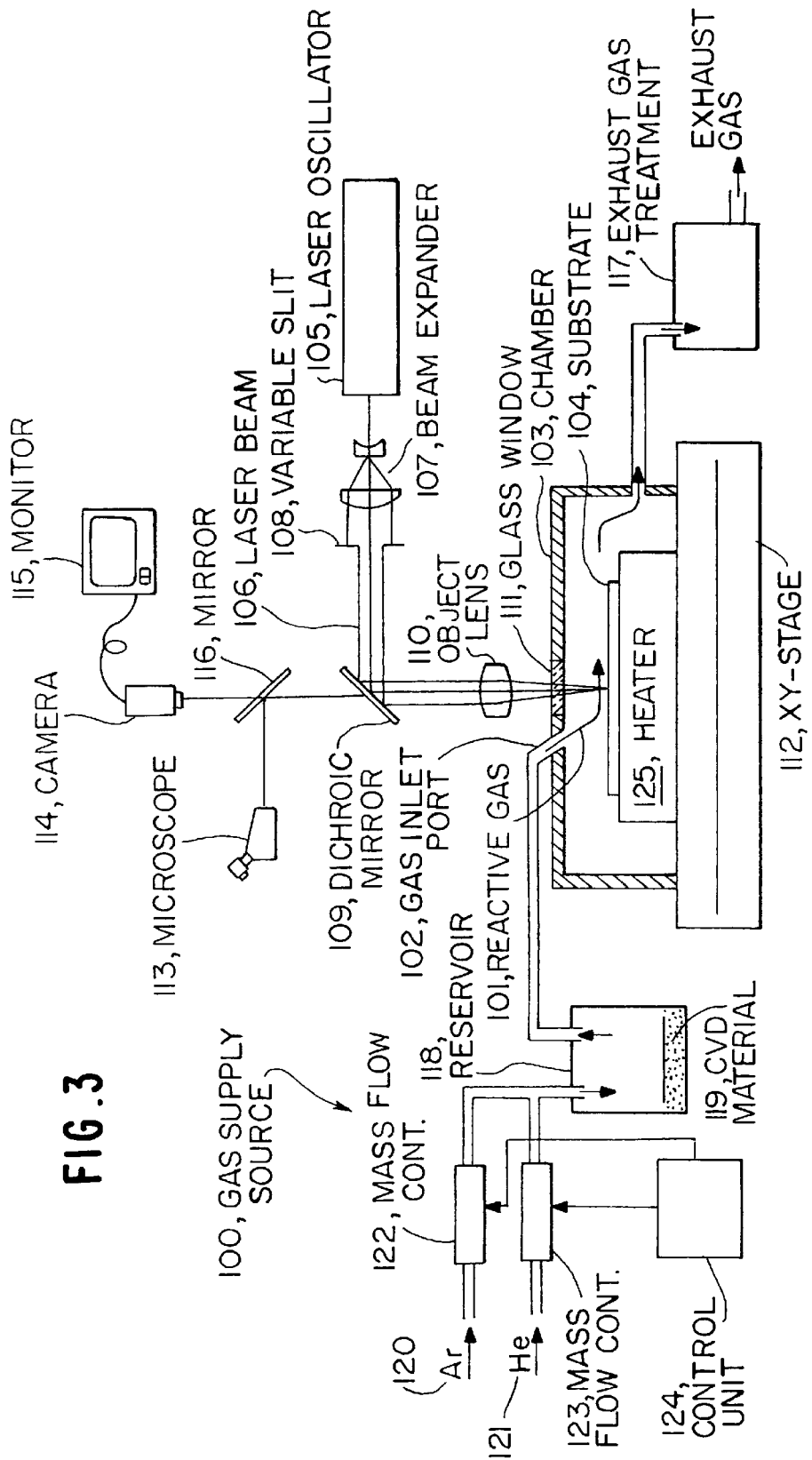
FIG. 3 illustrates the configuration of a first preferred embodiment of the present invention.

Referring to FIG. 3, a reactive gas 101 is supplied by a gas supply source 100 onto a substrate 104 in a chamber 103 through a gas inlet port 102. On the other hand, a laser beam 106 emitted from a laser oscillator 105, after being expanded in diameter by a beam expander 107, passes a variable slit 108. The image of the opening of a desired size, obtained by the passage of the laser beam 106 through the variable slit 108, is formed on the substrate 104 via a dichroic mirror 109, an object lens 110 and a glass window 111.

The image of the opening formed by the laser beam 106 is scanned on the substrate 104 by driving an XY stage 112. The XY stage 112 is driven, while the substrate 104 is being observed by human eye through a microscope 113, so that the image of the opening is formed in a desired position on the substrate 104. The XY stage 112 may as well be driven while the substrate 104 is being pictured by a camera 114 and its image outputted on a monitor 115 is being observed.

Thus, the irradiation of a desired position on the substrate 104 with the laser beam 106 subjects the reactive gas 101 supplied into the chamber 103 to thermal resolution and causes a film to be deposited in the position where the laser beam 106 has formed the image of the opening.

Exhaust gas, including superfluous reactive gas for film deposition, is discharged outside after being treated by an exhaust gas treatment section 117.

Now will be described in further detail the configuration of the gas supply source 100, which is a characteristic aspect of this embodiment.

In a reservoir 118, there is stored as CVD material 119 powdery chromium carbonyl ($Cr(CO)_6$) for instance, and Ar gas 120 under flow rate control by a mass flow controller 122 is introduced into the reservoir 118. At the same time, helium (He) gas 121, having a different molecular weight from Ar gas 120, is introduced under flow rate control by another mass flow controller 123 into the reservoir 118. These Ar and He gases are used as carrier gases for feeding the reactive gas 101 into the chamber 103. The reservoir 118 is heated by a heat source (not shown) to sublimate the powdery $Cr(CO)_6$ 119 stored in the reservoir 118. The reactive gas 101 ($Cr(CO)_6$ gas) resulting from the sublimation is carried by the Ar gas 120 and the He gas 121 which are introduced into the reservoir 118, and supplied through the gas inlet port 102 onto the substrate 104 in the chamber 103.

In this process, the flow rate control of the carrier gases 120 and 121 by the mass flow controllers 122 and 123, respectively, is further controlled by a control unit 124. Since the position on the substrate 104 where is to be irradiated with the laser beam 106 can be detected by observing the monitor 115 for instance, the control unit 124 regulates the blending ratio between the Ar gas 120 and the He gas 121 to be introduced into the reservoir 118 to a desired value according to the position on the substrate 104 to be irradiated with the laser beam 106.

Although a mixture of two kinds of gases are used in this embodiment as carrier gases, a mixture of three or more kinds of gases can as well be used depending on the condition.

Next will be described the process of film deposition in this embodiment.

The laser beam 106 emitted from the laser oscillator 105, which may be for example the second harmonic beam of a continuously excited Q switch Nd:YAG laser (SH beam of 0.53 $\mu$m in wavelength) irradiates a desired position on the substrate 104, which is mounted on the XY stage 112 in the chamber 103, via the beam expander 107, variable slit 108, dichroic mirror 109, object lens 110 and glass window 111. Then, the $Cr(CO)_6$ gas which is the reactive gas 101 supplied onto the substrate 104 is resoluted by the laser beam 106. As a result, a metallic chrome film is deposited in the area on the substrate 104 irradiated with the laser beam 106. Here the substrate 104 is heated by a heater 125 to balance its temperature with the temperature of the reactive gas 101 as well as to control the volume of reactive gas molecules adsorbed to the surface of the substrate 104.

Although powdery $Cr(CO)_6$ is stored in the reservoir 118 as CVD material 119 in this embodiment, some other substance, such as molybdenum carbonyl ($Mo(CO)_6$), may as well be used.

Next will be explained the principle on the basis of which the concentration of the reactive gas supplied into the chamber is changed by modifying the blending ratio between the two kinds of carrier gases differing in molecular weight.

If two kinds of carrier gases differ from each other in molecular weight, the number of reactive gas molecules carried from the reservoir to the chamber by one carrier gas will differ from that carrier by the other carrier gas of the same quantity. Because the cross section of collision between carrier gas molecules and reactive gas molecules is different according to the molecular weight. Thus, if the carrier gas of the smaller molecular weight is used, the cross section of collision between the carrier gas molecules and the reactive gas molecules will be smaller because of the smaller radius of the carrier gas molecules, resulting in a smaller volume of the reactive gas that is carried. Conversely, if the carrier gas of the greater molecular weight, whose molecules are greater in radius and accordingly have a larger cross section of collision with the reactive gas molecules, resulting in a greater volume of the reactive gas that is carried.

It is now supposed that the blending ratio between the carrier gases is modified without changing their total flow rate. If, for instance, the proportion of the carrier gas of the smaller molecular weight is increased, the carrying efficiency of the carrier gas of the reactive gas will be reduced and so will be the concentration of the reactive gas supplied. Conversely, if the proportion of the carrier gas of the greater molecular weight is increased, the carrying efficiency of the carrier gas of the reactive gas will be enhanced and so will be the concentration of the reactive gas supplied. The concentration of the reactive gas supplied to the chamber can be modified by changing the blending ratio between the carrier gases in this manner.

In this embodiment of the present invention, when a film is to be deposited in the peripheral part of the substrate 104, the mass flow controllers 122 and 123 provided on the introduction lines for the respective carrier gases are operated so as to increase the proportion of the carrier gas 120, i.e. Ar gas, having the greater molecular weight and to decrease that of the carrier gas 121, i.e. He Gas, having the smaller molecular weight. Then the increased proportion of the Ar gas 120 enhances the carrying efficiency for the reactive gas 101, resulting in an increased concentration of the reactive gas 101 that is supplied. Any reduction in the concentration of the reactive gas 101 due to its leak from the surface of the substrate 104 can be suppress and a film of high quality can be deposited.

Incidentally, the choice of carrier gases is not limited to Ar gas and He gas. The carrier gases to be used should desirably be hardly reactive to the reactive gas and the laser beam, and such gases include rare gases (He, Ar and Xe, etc.). Hydrogen ($H_2$) gas and nitrogen ($N_2$) gas are also usable. However, in order to make this embodiment fully effective, it is preferable to use at least two kinds of carrier gases evidently different from one another in molecular weight. It is therefore desirable to use He gas or $H_2$ gas as carrier gas of the smaller molecular weight and some other rare gas than He or $N_2$ gas as carrier gas of the greater molecular weight. For this embodiment, the combination of He gas and Ar gas is chosen in view of their relatively low costs and handling ease. However, where $Cr(CO)_6$ is to be used as reactive gas, the use of xenon (Xe) gas instead of Ar gas would enable this embodiment to function even more effectively, since the molecular weight of Xe gas is greater than that of Ar gas and closer to that of $Cr(CO)_6$.

In this embodiment, the time taken to modify the reactive gas concentration by changing the blending ratio between carrier gases, which depends on the piping length from the reservoir to the chamber, is only about two to three minutes if the piping is ¼ inch in external diameter and 3 to 4 m in length. The fact means a high level of responsiveness. If the blending ratio among the at least kinds of carrier gases is properly set, it will be possible to regulate the reactive gas concentration with a resolving power of 1% or less.

Figure 4:
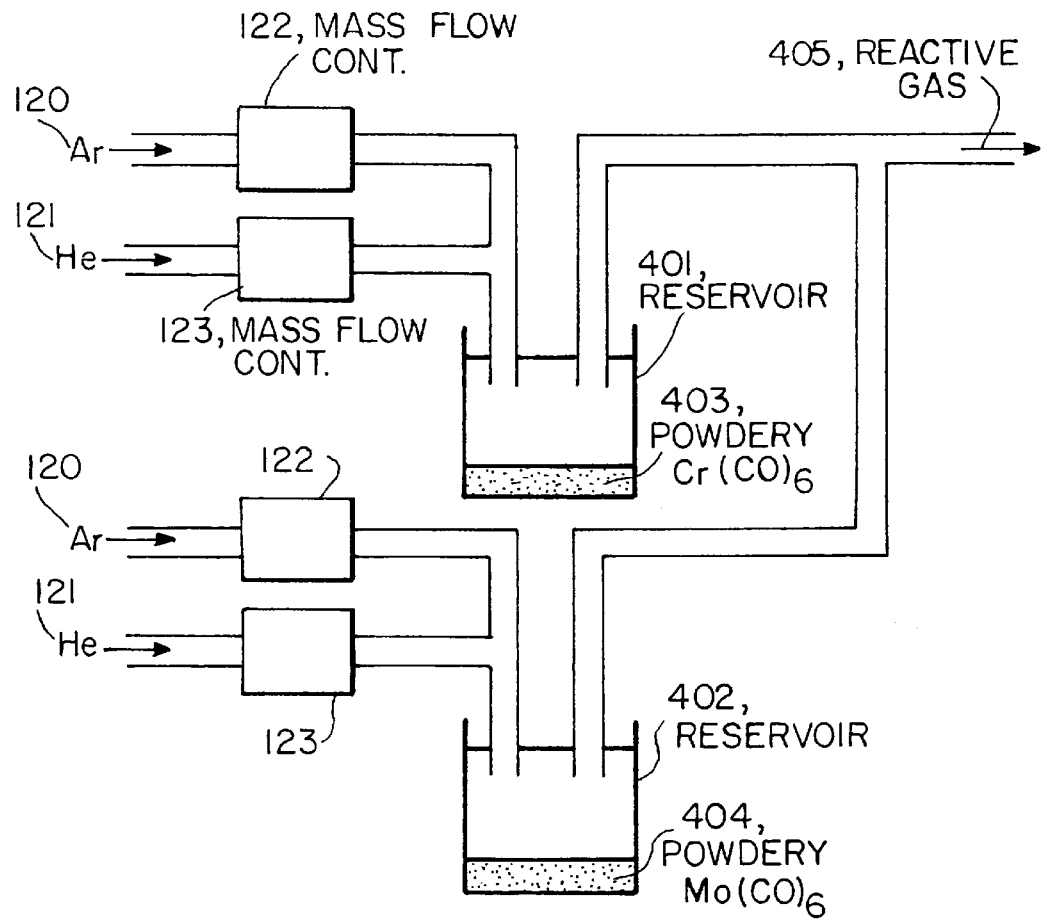
FIG. 4 illustrates a configuration for the supply of a reactive gas in a second preferred embodiment of the invention.

Next will be described a second preferred embodiment of the present invention with reference to FIG. 4.

This second embodiment uses a mixture of at least two kinds of organic metallic gases as reactive gas 405. If, for example, a mixture of $Cr(CO)_6$ and $Mo(CO)_6$ gas is to be used as reactive gas, two reservoirs 401 and 402 will be provided as illustrated in FIG. 4. In the reservoir 401 is stored powdery $Cr(CO)_6$ 403 and, in the reservoir 402, powdery $Mo(CO)_6$ 404. A plurality of carrier gas introduction lines will be installed, as described above referring to the first embodiment, for the reservoirs 401 and 402. In the same manner as for the above described first embodiment, the concentrations of the reactive gases fed from the reservoirs 401 and 402 can be controlled precisely. It is therefore possible to eventually regulate the blending ratio between $Cr(CO)_6$ and $Mo(CO)_6$ in the reactive gas 405 supplied into the chamber. Incidentally, where a mixture of at least two kinds of organic metallic gases is used, it is desirable to change the blending ratio between the organic metallic gases without altering the total flow rate of the mixture.

Next will be described a third preferred embodiment of the present invention with reference to FIGS. 5 through 8.

In this embodiment, the surface of the substrate 104 is divided into a plurality of areas, for example the central part and the peripheral part, and the blending ratio between at least two kinds of carrier gases is registered in advance for each area. The carrier gas blending ratio is set according to the areas in which a film is to be deposited actually, and the reactive gas concentration is automatically altered on that basis. In this way, the reactive gas of the optimal concentration can be supplied for the deposition of a high quality film in every area.

Figure 5:
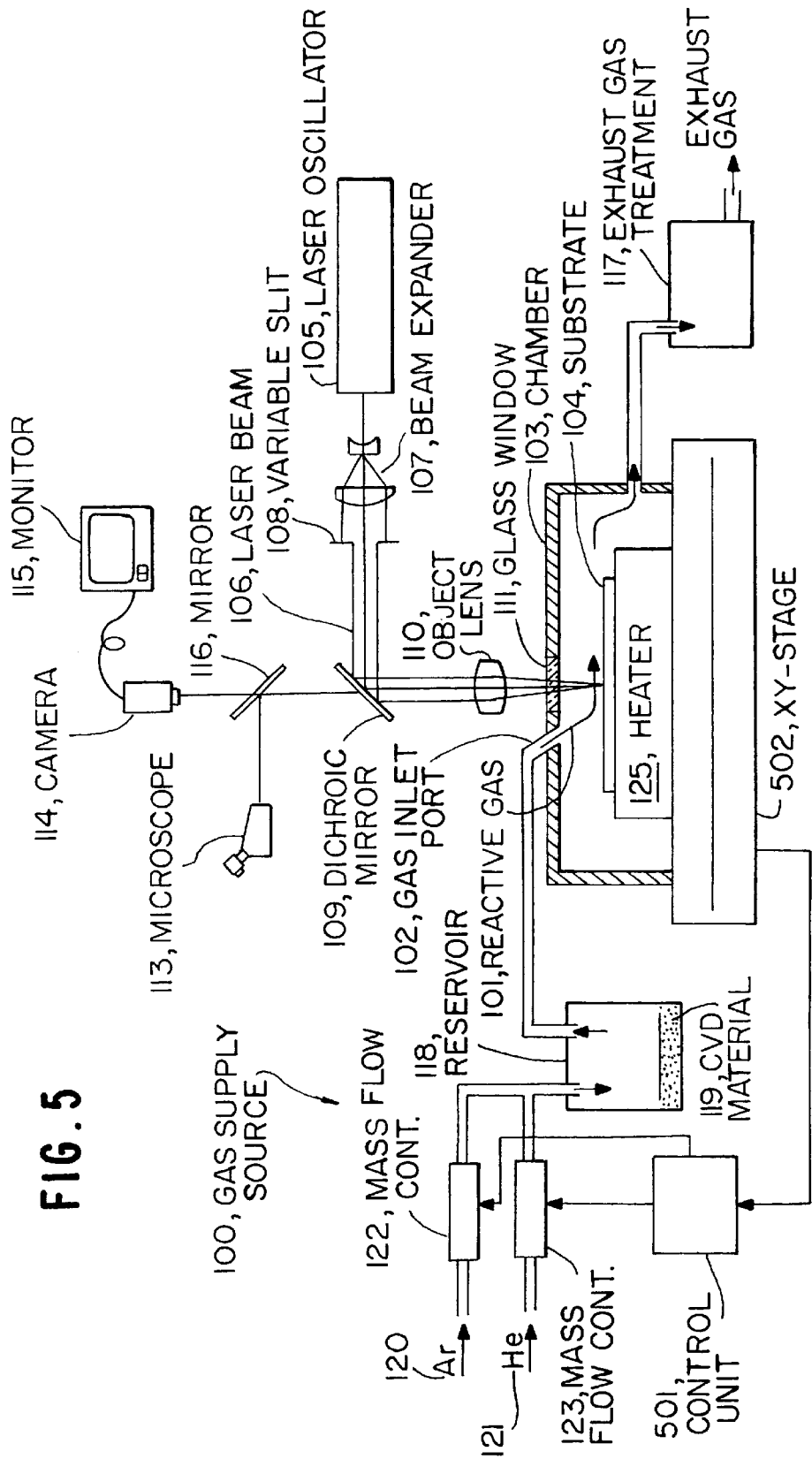
FIG. 5 illustrates the configuration of a third preferred embodiment of the invention.

Referring to FIG. 5, a control unit 501 controls mass flow controllers 122 and 123 according to positional information, which is supplied from an XY stage 502, corresponding to the position on the substrate 104 to be irradiated with the laser beam 106. Thus, the control unit 501 sets the blending ratio between the Ar gas 120 and the He gas 121 to a predetermined value according to the position on the substrate 104 to be irradiated with the laser beam 106. Other aspects of the configuration are similar to those of the above described first embodiment.

Figure 6:
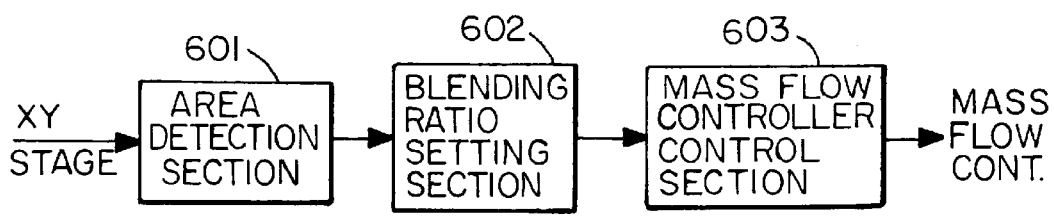
FIG. 6 is a block diagram illustrating the configuration of the control unit in the third preferred embodiment.
Figures 7, 8:
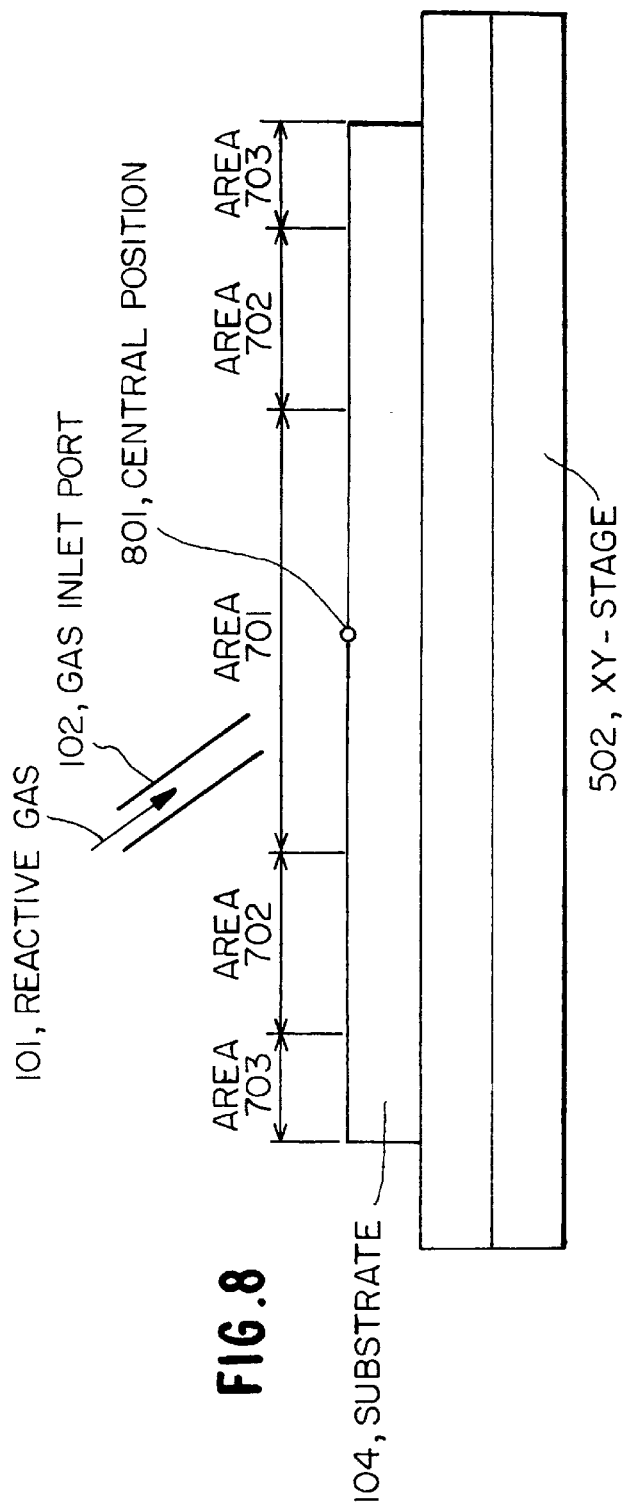
FIG. 7 is a table which is stored in the blending ratio setting section in FIG. 6 and in which are registered the optimal carrier gas blending ratios for different areas wherein a film is to be formed.
FIG. 8 illustrates different areas on the substrate referred to in FIG. 7.

FIG. 6 is a block diagram illustrating details of the control unit. An area detecting section 601 detects the area on the substrate 104 to be irradiated with the laser beam 106 on the basis of the positional information sent from the XY stage 502. Thus the area detecting section 601 detects the area where a film is to be deposited. In a blending ratio setting section 602, the blending ratio between the Ar gas 120 and the He gas 121 to be introduced into the reservoir 118 for each of the prescribed areas is stored in an ROM or the like in a tabular form as shown in FIG. 7. The carrier gas blending ratio corresponding to the area detected by the area detecting section 601 is read out of the ROM or the like, and that blending ratio is set. The areas listed in FIG. 7 are set by division according to the distance from the central position 801 of the substrate 104 as illustrated in FIG. 8. A mass flow controller control section 603 controls the mass flow controllers 122 and 123 so as to introduce the mixture of Ar gas 120 and He gas 121 having the blending ratio set by the blending ratio setting section 602 into the reservoir 118 as carrier gas.

While the substrate 104 is being observed through the microscope 113 or the like, the XY stage 502 is driven to set the target of laser beam irradiation to the position on the substrate 104 where a film is to be deposited. At this time, positional information corresponding to the position on the substrate 104 to be irradiated with the laser beam 106 by the XY stage 502 is sent to the control unit 501. The control unit 501, which detects the area in which a film is to be deposited on the basis of the positional information, is provided with a table in which, as shown in FIG. 7, the optimal carrier gas blending ratio for each area of the substrate is registered in advance. The optimal carrier gas blending ratio is set according to the detected area for film deposition, and the mass flow controllers 122 and 123 are controlled according to the blending ratio so set. As the carrier gas blending ratio is modified, the concentration of the reactive gas 101 supplied onto the substrate 104 also changes. Now, irradiation of the substrate 104 with the laser beam 106 will result in the deposition of a film of desired quality. Here, for the area 703 in the table of FIG. 7, i.e. where a film is to be deposited on the peripheral part of the substrate 104, the concentration of the reactive gas 101 has to be increased, and accordingly the proportion of the carrier gas of the greater molecular weight, i.e. the Ar gas 120, is set higher. Conversely, for the area 701 in the table, as there is no need to increase the concentration of the reactive gas 101, the proportion of the Ar gas 120 is set relatively low.

Incidentally, this embodiment has a configuration in which the control unit 501 controls the mass flow controllers 122 and 123 in response to information from the XY stage 502. However, it may as well be so configured that sequence information indicating the film formation process be registered in advance in a memory circuit in the control unit 501, and not only the mass flow controllers 122 and 123 but also the XY stage 502 and the laser oscillator 105 among others can be controlled in accordance with that sequence information.

Next will be described a fourth preferred embodiment of the present invention with reference to FIG. 9.

This embodiment uses as carrier gas a mixture of at least two kinds of gases in the optimal blending ratio for the given size of the irradiation spot of the laser beam.

A prior art according to which a film having a satisfactory profile can be formed by changing stepwise the size of the irradiation spot of the laser beam while the film is being formed is disclosed in the Japanese Patent Laid-open No. 1990-260527. However, changing the irradiation spot size of the laser beam would affect the status balance of the film formation process and obstruct the formation of a film of uniform properties.

On the other hand, it is possible to prevent the balance of the film formation process from changing by modifying the concentration of the reactive gas supplied into the chamber according to the variation in the irradiation spot size of the laser beam. In this embodiment, the concentration of the reactive gas is modified in a short period of time by controlling the blending ratio of at least two kinds of gases which constitute the carrier gas according to the variation in the irradiation spot size of the laser beam.

Figure 9:
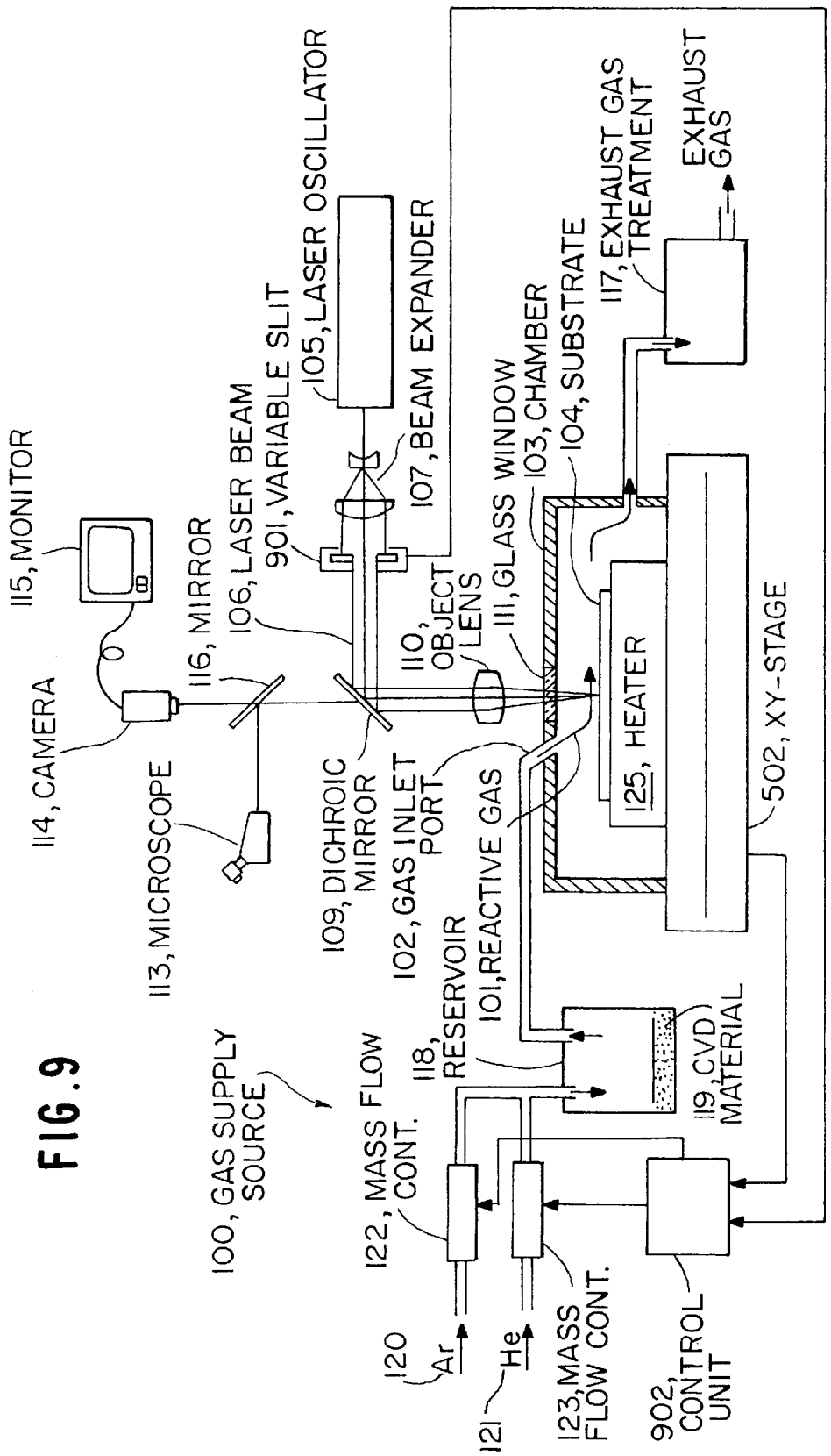
FIG. 9 illustrates the configuration of a fourth preferred embodiment of the invention.

Referring to FIG. 9, information indicating the size of a variable slit 901 is transmitted from the variable slit 901 to a control unit 902. The control unit 902 controls the mass flow controllers 122 and 123 on the basis of that information. Other aspects of the configuration are similar to those of the above described third embodiment. The spot size of a laser beam 106 which irradiates the substrate 104 is controlled by the size of the variable slit 901 which the laser beam 106 has passed. The size of the variable slit 901 varies stepwise in a preset sequence. Accordingly, this embodiment can form a satisfactory film by controlling the concentration of the reactive gas 101 by the method described for the aforementioned first embodiment.

Now will be described a fifth preferred embodiment of the present invention with reference to FIG. 10.

This embodiment forms a film on the substrate by subjecting the reactive gas directly to photodecomposition by an ultraviolet laser beam. It uses a gas supply source of the same configuration as that for the above described first embodiment.

Figure 10:
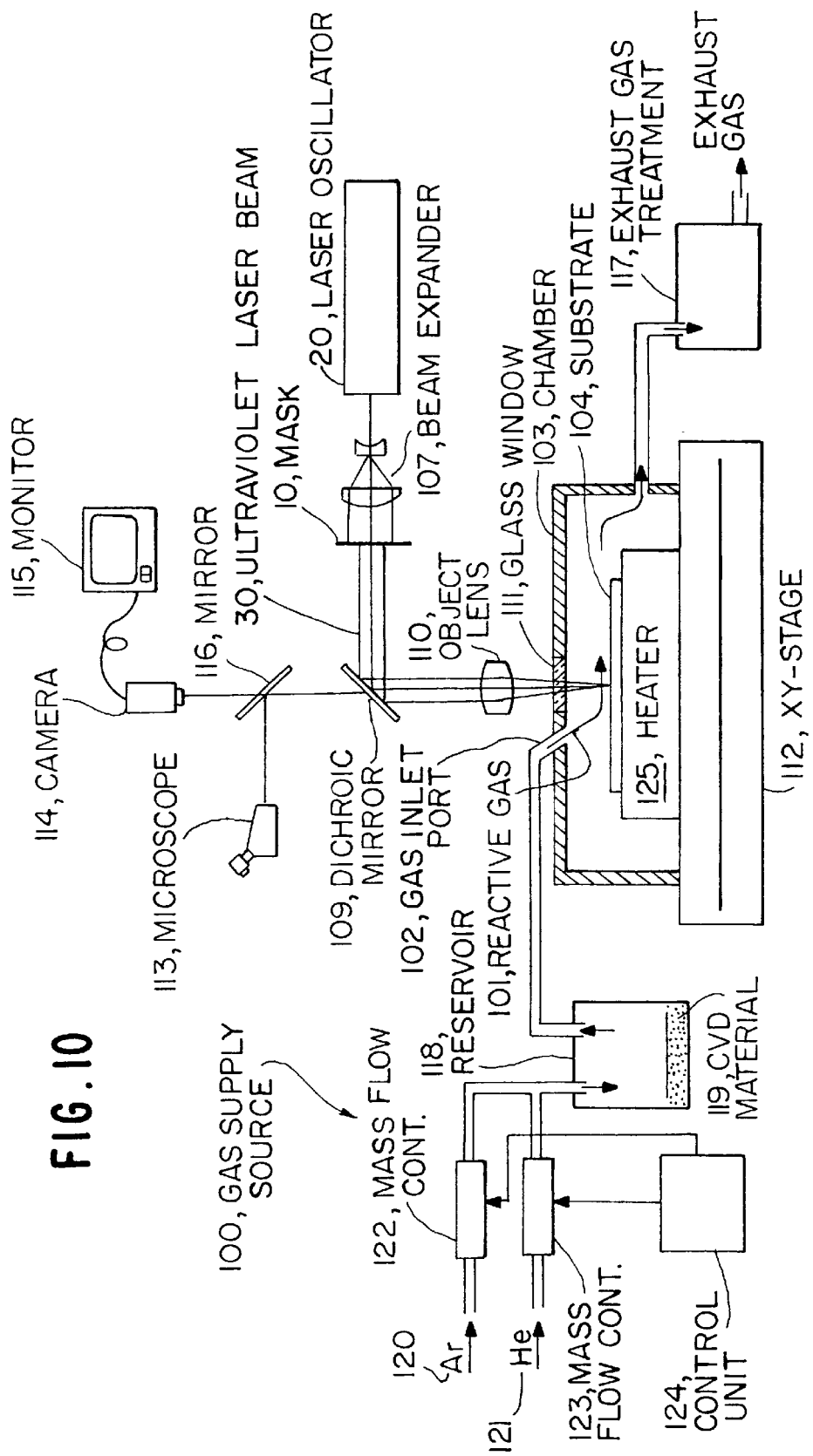
FIG. 10 illustrates the configuration of a fifth preferred embodiment of the invention.

Referring to FIG. 10, this embodiment is provided with a mask 10, in place of the variable slit, on the optical axis of an ultraviolet laser beam 30 emitted from a laser oscillator 20. By imaging a pattern drawn on that mask 10 onto the substrate 104, film formation can be achieved collectively over a large area of the substrate 104.

Laser CVD methods using an ultraviolet laser oscillator as light source include one achieving film formation by using a photodissociative reaction. This film formation process takes about three seconds to complete. If irradiation with the ultraviolet laser beam is continued any longer, the formed film itself will become a heat sink. This would bring down the process temperature in the CVD reaction area to obstruct sufficient reaction of the reactive gas, resulting in the deposition of a film formed by incomplete resolution.

In view of this problem, this embodiment is designed to maintain the process balance by increasing the output of the laser oscillator 10 gradually and at the same time reducing the concentration of the reactive gas to be supplied into the chamber 103. In this way, a film of satisfactory quality can be formed, even when film formation is to be accomplished by irradiation with the ultraviolet laser beam 30 for a few seconds above three seconds, by modifying the reactive gas concentration during irradiation with the ultraviolet laser beam.

Next will be described a sixth preferred embodiment of the present invention with reference to FIG. 11.

When repairing a defect in a photomask, a film formation technique by laser CVD is applied. The defect in the photomask is repaired by covering the defective part with a film formed by laser CVD. In this process, the film thereby formed should precisely reproduce the edge of the pattern drawn on the repaired photomask. Furthermore, in the process to wash the photomask, the adhesion of the film to the substrate should be strengthened so that the formed film may not peel off.

However, no film fully satisfying the aforementioned requirements can be formed merely by independently applying the film formation technique by thermal CVD using a visible laser beam or that by optical CVD using an ultraviolet laser beam. Thus, film formation by thermal CVD using a visible laser beam hardly permits precise control of the edge of the film, and would result in the formation of an extra part of film overflowing the contour of the pattern on the normal photomask. On the other hand, film formation by optical CVD using an ultraviolet laser light, though excelling in the controllability of the film shape, would result in markedly poor quality of the deposited film, which would peel off during the washing process.

In view of these problems, this embodiment applies optical CVD using an ultraviolet laser beam, which excels in the controllability of the film edge, to deposit a first film so as to cover the defective part and, after that, thermal CVD using a visible laser beam to form a second film excelling in chemical resistance so as to cover the first film. By this combination of film formation by optical CVD and that by thermal CVD, it is made possible to secure a highly precise edge for the corrected pattern as well as to prevent the film from peeling off during the washing process of the photomask.

Here, optical CVD differ from thermal CVD in the optimal concentration of the reactive gas. Film formation by thermal CVD requires a reactive gas about 10 times more concentrated as that by optical CVD does. Therefore, in a film formation process using optical CVD and thermal CVD in combination, the concentration of the reactive gas should be modified from one phase of the process to the other. This embodiment modifies the concentration of the reactive gas precisely in a short period of time by applying the control method for the reactive gas concentration described above with respect to the first embodiment of the invention.

Figure 11:
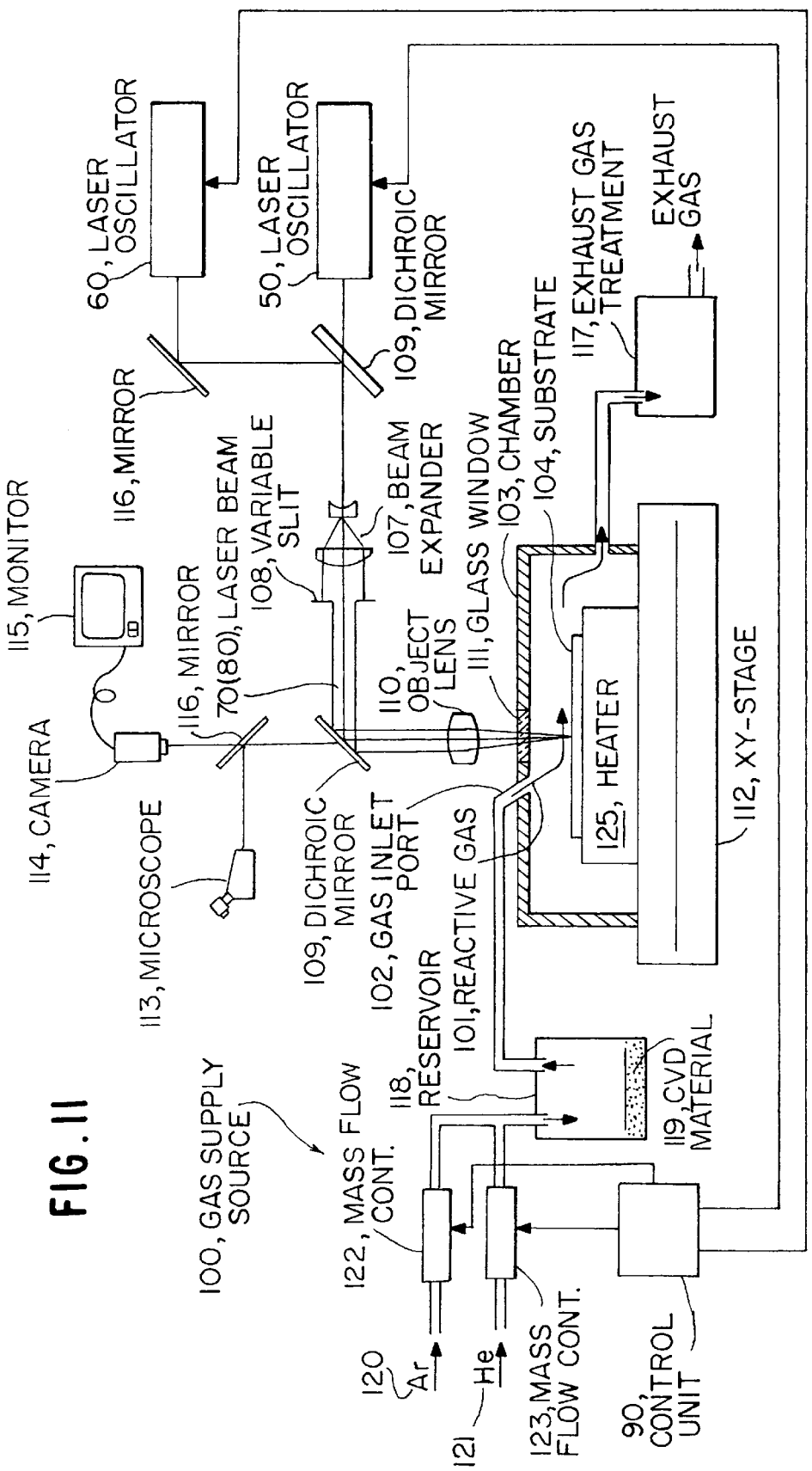
FIG. 11 illustrates the configuration of a sixth preferred embodiment of the invention.

Referring to FIG. 11, two laser oscillators 50 and 60 are provided as beam sources. The laser oscillator 50 is intended for use in film formation by thermal CVD, while the laser oscillator 60 is for use in that by optical CVD. In forming said first film, an ultraviolet laser beam 70 emitted from the laser oscillator 60 irradiates the substrate 104 via the beam expander 107 and the variable slit 108 among other elements. On the other hand, in forming said second film, a visible laser beam 80 emitted from the laser oscillator 50 irradiates the substrate 104 via a mirror 116, the beam expander 107 and the variable slit 118 among other elements. A control unit 90, while controlling the laser oscillators 50 and 60 in a preset sequence, controls the mass flow controllers 122 and 123 so as to match its control of the laser oscillators. When a film is to be formed by optical CVD with the ultraviolet laser beam 70 emitted from the laser oscillator 60, the control unit 90 controls the mass flow controllers 122 and 123 so as to reduce the proportion of the Ar gas 120. On the other hand, when a film is to be formed by thermal CVD with the visible laser beam 80 emitted from the laser oscillator 50, the control unit 90 controls the mass flow controllers 122 and 123 so as to increase the proportion of the Ar gas 120. In this manner, a reactive gas 101 of the concentration suited to each CVD method can be supplied into the chamber 103.

As hitherto described, the present invention makes it possible always to form a film of high quality by modifying the supply volume of the reactive gas whenever any change occurs in environment so as to optimize the supply volume for the changed environment.

What is claimed is:

1. A film formation method for depositing a film on a substrate by irradiating said substrate with a laser beam, comprising the steps of:
   introducing at least two kinds of carrier gases non-reactive to reactions in depositing said film on said substrate, differing from each other in molecular weight:
   supplying a reactive gas into a reaction chamber, in which a substrate is placed, by using a mixture of said at least two kinds of non-reactive carrier gases;
   during operation of the method, controlling a composition of said mixture of at least two kinds of non-reactive carrier gases to control an efficiency of supplying the reactive gas; and
   irradiating said substrate with a laser beam to deposit a film on said substrate, wherein said mixture of carrier gases is formed by blending a first carrier gas with at least one different carrier gas;
   wherein said controlling step comprises the steps of:
      increasing a proportion of a carrier gas having a smaller molecular weight in said mixture to reduce an efficiency of supplying the reactive gas; and
      increasing a proportion of a carrier gas having a greater molecular weight in said mixture to enhance said efficiency.

2. A film formation method, as claimed in claim 1, further including the step of changing a blending ratio between the at least two kinds of carrier gases contained in said mixture, wherein each of said at least two kinds of non-reactive carrier gases is selected from the group consisting of the noble gases and hydrogen ($H_2$) and nitrogen ($N_2$).

3. A film formation method, as claimed in claim 2, whereby the blending ratio between the at least two kinds of carrier gases contained in said mixture is changed without altering a total flow rate of the mixture.

4. A film formation method, as claimed in claim 2, wherein:
   an ultraviolet laser beam is used as said laser beam, and which further includes the steps of:
      increasing an output of said ultraviolet laser beam gradually, and
      reducing a concentration of said reactive gas by changing the blending ratio between the at least two kinds of carrier gases contained in said mixture according to the output.

5. A film formation method, as claimed in claim 1, further including the steps of:
   detecting a size of an irradiating spot of said laser beam, and
   changing a blending ratio between the at least two kinds of carrier gases contained in said mixture according to the detected size.

6. A film formation method, as claimed in claim 1, wherein at least one of the at least two kinds of carrier gases constituting said mixture is either helium or hydrogen gas and at least one of the other kinds of carrier gases is either a non-helium rare gas or nitrogen gas.

7. A film formation method, as claimed in claim 1, wherein said mixture consists of argon gas and helium gas.

8. A film formation method, as claimed in claim 1, wherein said mixture consists of xenon gas and helium gas.

9. A film formation method, as claimed in claim 1, further including the steps of:
   detecting an area on said substrate to be irradiated with said laser beam, and
   changing a blending ratio between the at least two kinds of carrier gases contained in said mixture according to the detected area.

10. A film formation method, as claimed in claim 1, wherein said supplying step includes the steps of:
    generating the reactive gas by sublimating an organic metallic compound which is stored in a reservoir;
    supplying the at least two kinds of carrier gases differing from each other in molecular weight into the reservoir; and
    carrying the reactive gas to the reaction chamber by using the carrier gases which are supplied into the reservoir;
    wherein each of said at least two kinds of non-reactive carrier gases is selected from the group consisting of the noble gases, hydrogen ($H_2$), and nitrogen ($N_2$).

11. A film formation method, as claimed in claim 1, wherein said first carrier gas is helium and said different carrier gas is a rare gas other than helium.

12. A film formation method, as claimed in claim 11, wherein said first carrier gas is helium and said second carrier gas is argon.

13. A film formation apparatus for depositing a film on a substrate by irradiating the substrate with a laser beam, comprising:
    a carrier gas introduction having at least two lines for respectively introducing carrier gases non-reactive to reactions in depositing said film on said substrate, said carrier gases differing from each other in molecular weight;
    means for supplying a reactive gas into a reaction chamber, in which a substrate is placed, by using a mixture of said at least two kinds of non-reactive carrier gases from said carrier gas introduction;
    means for irradiating said substrate with a laser beam to deposit a film on said substrate;
    means for forming said mixture of non-reactive carrier gases by blending a first non-reactive carrier gas with at least one different non-reactive carrier gas; and
    means for controlling a composition of said mixture of at least two kinds of non-reactive carrier gases during operation of the apparatus to control an efficiency of supplying the reactive gas;

wherein said means for controlling a composition comprises:

means for increasing a proportion of a carrier gas having a smaller molecular weight in said mixture to reduce said efficiency; and means for increasing a proportion of a carrier gas having a greater molecular weight in said mixture to enhance said efficiency.

14. A film formation apparatus, as claimed in claim 13, further including:

means for detecting an area on said substrate to be irradiated with said laser beam, and means for changing a blending ratio between the at least two kinds of carrier gases contained in said mixture according to the detected area.

15. A film formation apparatus, as claimed in claim 13, further including:

means for detecting a size of an irradiation spot of said laser beam, and means for changing a blending ratio between the at least two kinds of carrier gases contained in said mixture according to the detected size.

16. A film formation apparatus, as claimed in claim 13, wherein said means for forming said mixture comprises a first line for introducing said first carrier gas, and a separate, second line for introducing a second carrier gas.

17. A film formation apparatus, as claimed in claim 13, wherein said means for forming said mixture comprises a first mass flow controller for introducing said first carrier gas, and a separate second mass flow controller for introducing a second carrier gas.

18. A film formation apparatus, as claimed in claim 13, further including means for changing a blending ratio between the at least two kinds of carrier gases contained in said mixture.

19. A film formation apparatus, as claimed in claim 18, wherein said apparatus comprises means for adjusting the blending ratio between the at least two kinds of non-reactive carrier gases contained in said mixture without altering a total flow rate of the mixture.

20. A film formation apparatus, as claimed in claim 13, wherein said supplying means comprises:

reservoir for storing an organic metallic compound;

means for generating the reactive gas by sublimating the organic metallic compound; and means for supplying at least two kinds of non-reactive carrier gases differing from each other in molecular weight into the reservoir.

21. A method for depositing a film on a substrate, including the steps of:

introducing at least two kinds of carrier gases non-reactive to reactions in depositing said film on said substrate, differing from each other in molecular weight;

supplying a reactive gas into a reaction chamber, in which a substrate is placed, by using a mixture of said at least two kinds of non-reactive carrier gases;

depositing a first film on said substrate by irradiating said substrate with an ultraviolet laser beam;

during operation of the method, changing a blending ratio between the at least two kinds of non-reactive carrier gases contained in said mixture to change a concentration of said reactive gas supplied into said reaction chamber;

supplying said reactive gas into the reactive chamber by using said mixture whose blending ratio has been modified; and depositing a second film over said first by irradiating said first film with a visible laser beam;

wherein said changing step comprises the steps of:

increasing a proportion of a carrier gas having a smaller molecular weight in said mixture to reduce an efficiency of supplying the reactive gas; and increasing a proportion of a carrier gas having a greater molecular weight in said mixture to enhance said efficiency.

22. A film formation apparatus for depositing a film on a substrate, comprising:

means for irradiating a substrate with a visible laser beam;

a carrier gas introduction having at least two lines for respectively introducing carrier gases non-reactive to reactions in depositing said film on said substrate, said carrier gases differing from each other in molecular weight;

means for supplying a reactive gas into a reaction chamber in which said substrate is placed by using a mixture of at least two kinds of non-reactive carrier gases from said carrier gas introduction; and means for changing a blending ratio between the at least two kinds of non-reactive carrier gases contained in said mixture during operation of the apparatus according to the type of laser beam irradiating said substrate;

wherein said means for changing a blending ratio comprises:

means for increasing a proportion of a carrier gas having a smaller molecular weight in said mixture to reduce a supplying efficiency of said reactive gas supplied into said reaction chamber; and means for increasing a proportion of a carrier gas having a greater molecular weight in said mixture to enhance said supplying efficiency.

23. A method for depositing a film on a substrate, including the steps of:

introducing He gas and Xe gas;

supplying a reactive gas into a reaction chamber, in which a substrate is placed, by using a mixture of said He gas and Xe gas;

depositing a first film on said substrate by irradiating said substrate with an ultraviolet laser beam;

changing a blending ratio between the He gas and Xe gas contained in said mixture during operation of the method to change a supplying efficiency of said reactive gas supplied into said reaction chamber;

supplying said reactive gas into a reactive chamber by using said mixture whose blending ratio has been modified; and depositing a second film over said first film by irradiating said first film with a visible laser beam;

wherein said changing step comprises the steps of:

increasing a proportion of He gas in said mixture to reduce a supplying efficiency of said reactive gas supplied into said reaction chamber; and increasing a proportion of Xe gas in said mixture to enhance said supplying efficiency.

24. A film formation apparatus for depositing a film on a substrate, comprising:

means for irradiating a substrate with a visible laser beam;

a carrier gas introduction having two lines for introducing He gas and Xe gas respectively;

means for supplying a reactive gas into a reaction chamber in which substrate is placed by using a mixture of said He gas and Xe gas from said carrier gas introduction; and means for changing a blending ratio between the He gas and Xe gas contained in said mixture during operation of the apparatus according to the type of laser beam irradiating said substrate;

wherein said means for changing a blending ratio comprises:

means for increasing a proportion of He gas in said mixture to reduce said supplying efficiency; and means for increasing a proportion of Xe gas in said mixture to enhance said supplying efficiency.

25. A film formation method for depositing a film on a substrate by irradiating said substrate with a laser beam, comprising the steps of:

introducing He gas and Xe gas;

supplying a reactive gas into a reaction chamber, in which a substrate is placed, by using a mixture of said He gas and Xe gas;

changing a blending ratio between the He gas and Xe gas contained in said mixture during operation of the method; and irradiating said substrate with a laser beam to deposit a film on said substrate;

wherein said changing step comprises the steps of:

increasing a proportion of He gas in said mixture to reduce a supplying efficiency of said reactive gas supplied into said reaction chamber; and increasing a proportion of Xe gas in said mixture to enhance said supplying efficiency.

26. A film formation method, as claimed in claim 25, wherein:

an ultraviolet laser beam is used as said laser beam, and which further includes the steps of:

increasing an output of said ultraviolet laser beam gradually, and reducing a concentration of said reactive gas by changing the blending ratio between the He gas and Xe gas contained in said mixture according to the output.

27. A film formation method, as claimed in claim 25, whereby the blending ratio between the He gas and Xe gas contained in said mixture is changed without altering a total flow rate of the mixture.

28. A film formation method, as claimed in claim 25, which further includes the step of detecting an area on said substrate to be irradiated with said laser beam, and the step of changing said blending ratio is changing said blending ratio according to the detected area.

29. A film formation method, as claimed in claim 25, which further includes the step of detecting a size of an irradiating spot of said laser beam, and the step of changing said blending ratio is changing said blending ratio according to the detected size.

30. A film formation apparatus for depositing a film on a substrate by irradiating the substrate with a laser beam, comprising:

a carrier gas introduction having two lines for introducing He gas and Xe gas respectively;

means for supplying a reactive gas into a reaction chamber, in which a substrate is placed, by using a mixture of said He gas and Xe gas from said carrier gas introduction;

means for irradiating said substrate with a laser beam to deposit a film on said substrate;

means for forming said mixture of He gas and Xe gas; and means for changing a blending ratio between the He gas and Xe gas contained in said mixture during operation of the apparatus;

wherein said means for changing a blending ratio comprises:

means for increasing a proportion of He gas in said mixture to reduce said supplying efficiency; and means for increasing a proportion of Xe gas in said mixture to enhance said supplying efficiency.

31. A film formation apparatus, as claimed in claim 30, wherein said supplying means comprises:

a reservoir for storing an organic metallic compound;

means for generating the reactive gas by sublimating the organic metallic compound; and means for supplying He gas and Xe gas into the reservoir.

32. A film formation apparatus, as claimed in claim 30, wherein said means for forming said mixture comprises a first mass flow controller for introducing said He gas, and a separate, second mass flow controller for introducing said He gas.

33. A film formation apparatus, as claimed in claim 30, wherein said apparatus comprises means for adjusting the blending ratio between the He gas and Xe gas contained in said mixture without altering a total flow rate of the mixture.

34. A film formation apparatus, as claimed in claim 30, which further includes means for detecting an area on said substrate to be irradiated with said laser beam, and means for changing said blending ratio changes said blending ratio according to the detected area.

35. A film formation apparatus, as claimed in claim 30, which further includes means for detecting a size of an irradiating spot of said laser beam, and means for changing said blending ratio changes said blending ratio according to the detected size.

36. A film formation apparatus, as claimed in claim 30, wherein said means for forming said mixture comprises a first line for introducing said He gas, and a separate, second line for introducing said Xe gas.

* * * * *